US008798409B2

(12) United States Patent
Pardo et al.

(10) Patent No.: US 8,798,409 B2
(45) Date of Patent: Aug. 5, 2014

(54) OPTICAL TRANSMITTER WITH FLIP-CHIP MOUNTED LASER OR INTEGRATED ARRAYED WAVEGUIDE GRATING WAVELENTH DIVISION MULTIPLEXER

(75) Inventors: Flavio Pardo, New Providence, NJ (US); Mark Earnshaw, Morristown, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 267 days.

(21) Appl. No.: 12/944,917

(22) Filed: Nov. 12, 2010

(65) Prior Publication Data

US 2012/0087620 A1    Apr. 12, 2012

Related U.S. Application Data

(60) Provisional application No. 61/390,798, filed on Oct. 7, 2010, provisional application No. 61/390,876, filed on Oct. 7, 2010, provisional application No. 61/390,840, filed on Oct. 7, 2010, provisional application No. 61/390,837, filed on Oct. 7, 2010.

(51) Int. Cl.
| | |
|---|---|
| *G02B 6/12* | (2006.01) |
| *G02B 6/26* | (2006.01) |
| *G02B 6/36* | (2006.01) |
| *G02B 6/10* | (2006.01) |
| *G02B 6/43* | (2006.01) |
| G02B 6/42 | (2006.01) |

(52) U.S. Cl.
CPC .............. *G02B 6/12019* (2013.01); *G02B 6/43* (2013.01); *G02B 6/12004* (2013.01); *G02B 6/4249* (2013.01)
USPC ................. 385/14; 385/52; 385/88; 385/129; 385/130; 385/131

(58) Field of Classification Search
CPC .... G02B 6/43; G02B 6/12004; G02B 6/4249; G02B 6/12009; G02B 6/12019
USPC ............... 385/14, 52, 88, 89, 92, 93, 94, 129, 385/130, 131
See application file for complete search history.

(56) References Cited

U.S. PATENT DOCUMENTS

| | | | |
|---|---|---|---|
| 5,212,745 A | 5/1993 | Miller | |
| 5,780,875 A * | 7/1998 | Tsuji et al. | 257/81 |

(Continued)

FOREIGN PATENT DOCUMENTS

| | | |
|---|---|---|
| JP | 2000137148 A | 5/2000 |
| JP | 2009-033556 A | 2/2009 |

(Continued)

OTHER PUBLICATIONS

D. T. Neilson et al, "Direct Laser Modulation", filed Jan. 31, 2011, U.S. Appl. No. 13/018,109.

(Continued)

*Primary Examiner* — Kaveh Kianni
*Assistant Examiner* — Hung Lam
(74) *Attorney, Agent, or Firm* — Hitt Gaines, PC

(57) ABSTRACT

An optical communication system comprising first and second planar substrates and an alignment assembly. The first substrate of a semiconductor material, is located on a planar surface of a sub-mount and having a planar first edge. The second substrate of a different second material, is located on said planar surface of said sub-mount and having a planar second edge. The alignment assembly is located on said sub-mount, said alignment assembly including rigid standoff structures configured to fixedly vertically align said first and second edges above said sub-mount such that each optical output of one of said lasers is vertically aligned with the end of one of said light-guiding structures.

18 Claims, 4 Drawing Sheets

(56) References Cited

U.S. PATENT DOCUMENTS

| | | | |
|---|---|---|---|
| 6,027,254 A * | 2/2000 | Yamada et al. | 385/88 |
| 6,034,799 A | 3/2000 | Hansen | |
| 6,316,281 B1 * | 11/2001 | Lee et al. | 438/31 |
| 6,700,910 B1 | 3/2004 | Aoki et al. | |
| 6,841,860 B2 | 1/2005 | Lee et al. | |
| 7,035,505 B2 | 4/2006 | Shen et al. | |
| 7,158,699 B2 | 1/2007 | Welch et al. | |
| 7,565,038 B2 | 7/2009 | Earnshaw | |
| 2002/0037025 A1 | 3/2002 | Bartman et al. | |
| 2002/0181519 A1 | 12/2002 | Vilhelmsson et al. | |
| 2002/0197010 A1 | 12/2002 | Kato et al. | |
| 2003/0081878 A1 | 5/2003 | Joyner et al. | |
| 2004/0141691 A1 | 7/2004 | Wiesmann et al. | |
| 2005/0213883 A1 | 9/2005 | Welch et al. | |
| 2005/0286909 A1 | 12/2005 | Kish, Jr. et al. | |
| 2007/0248139 A1 * | 10/2007 | Bischel et al. | 372/75 |
| 2008/0107429 A1 | 5/2008 | Galli et al. | |
| 2008/0112445 A1 | 5/2008 | Anselm | |
| 2009/0269069 A1 | 10/2009 | Mahgerefteh et al. | |
| 2010/0247021 A1 | 9/2010 | Cunningham et al. | |
| 2010/0247022 A1 | 9/2010 | Li et al. | |
| 2010/0247029 A1 | 9/2010 | Li et al. | |
| 2011/0103415 A1 | 5/2011 | Rasras | |

FOREIGN PATENT DOCUMENTS

| | | |
|---|---|---|
| JP | 2010-154063 A | 7/2010 |
| KR | 20000067245 A | 11/2000 |
| KR | 20030072001 A | 9/2003 |

OTHER PUBLICATIONS

M. P. Earnshaw, "Opto-Electronic Assembly for a Line Card", filed Nov. 12, 2010, U.S. Appl. No. 12/944,875.

D. T. Neilson et al, "Optical Assembly for a WDM Receiver or Transmitter", filed Nov. 12, 2010, U.S. Appl. No. 12/944,939.

D. Gill, "Wavelength Aligning Multi-Channel Optical Transmitters", filed Nov. 12, 2010, U.S. Appl. No. 12/945,550.

M. Rasras, "Thermally Controlled Semiconductor Optical Waveguide", filed Nov. 12, 2010, U.S. Appl. No. 12/944,946.

M. G. Young, et al., "A 16×1 Wavelength Division Multiplexer with Integrated Distributed Bragg Reflector Lasers and Electroabsorption Modulators", IEEE Photonics Technology Letters, vol. 5, No. 8, Aug. 1993, pp. 908-910.

Yiu-Man Wong, et al., Technology Development of a High-Density 32-Channel 16-Gb/s Optical Data Link for Optical Interconnection Applications for the Optoelectronic Technology Consortium (OETC), J. of Lightwave Technology, vol. 13, No. 6, Jun. 1995, pp. 995-1016.

C. R. Doerr, et al, "Monolithic Silicon Coherent Receiver", 2009 OSA/OFC/NFOEC 2009, PDPB2.pdf (2009), 3 pgs.

PCT International Search Report; PCT/US2011/059546; International Filing Date: Nov. 7, 2011; Mailing Date: Apr. 23, 2012; 6 pages.

* cited by examiner

OPTICAL TRANSMITTER WITH FLIP-CHIP MOUNTED LASER OR INTEGRATED ARRAYED WAVEGUIDE GRATING WAVELENTH DIVISION MULTIPLEXER

CROSS-REFERENCE TO RELATED APPLICATIONS

The present application claims the benefit of U.S. Provisional Patent Application No. 61/390,798 of the same title, filed Oct. 7, 2010 by Flavio Pardo and Mark Earnshaw. The present application is related to the previously filed U.S. Provisional Patent Application No. 61/390,798 of the same title, filed Oct. 7, 2010 by Flavio Pardo and Mark Earnshaw. The present application is also related to U.S. Provisional Patent Application No. 61/390,876, filed Oct. 7, 2010, by Pietro G. Bernasconi and David T Neilson, entitled, "DIRECT LASER MODULATION" ("Appl-1"); U.S. Provisional Patent Application No. 61/390,840 filed Oct. 7, 2010, by David Neilson, Nagesh Basavanhally, and Mark Earnshaw, entitled, "OPTICAL ASSEMBLY FOR A WDM RECEIVER OR TRANSMITTER" ("Appl-2"); U.S. Provisional Patent Application No. 61/390,837, filed Oct. 7, 2010, to Mark Earnshaw, entitled, "OPTO-ELECTRONIC ASSEMBLY FOR A LINE CARD" ("Appl-3"); U.S. patent application Ser. No. 12/944,946 by Mahmoud Rasras, entitled, "THERMALLY CONTROLLED SEMICONDUCTOR OPTICAL WAVEGUIDE", filed on Nov. 12, 2010; and U.S. patent application Ser. No. 12/945,550 by Douglas M. Gill, entitled, "WAVELENGTH ALIGNING MULTI-CHANNEL OPTICAL TRANSMITTERS", filed on Nov. 12, 2010, which are all incorporated herein by reference in their entirety. One or more of the above applications may describe optical receiver structures, optical transmitter structures, methods of making optical receiver and/or optical transmitter structures and/or methods of using optical receiver and/or transmitter components that may be suitable for making and/or using embodiments described herein.

TECHNICAL FIELD

The present disclosure is directed, in general, to an optical communication system and more specifically, an optical transmitter, and, methods of manufacturing the same.

BACKGROUND

This section introduces aspects that may be helpful to facilitating a better understanding of the inventions. Accordingly, the statements of this section are to be read in this light. The statements of this section are not to be understood as admissions about what is in the prior art or what is not in the prior art.

Optical communication systems can include a transmitter component that includes a laser and waveguide that are optically coupled. It is desirable to efficiently couple light transmitted from the laser to the waveguide, e.g., to transmit a communication signal over a maximum distance for a given amount of power applied to the laser.

SUMMARY

One embodiment of the disclosure is an optical communication system. The system comprises first and second planar substrates and an alignment assembly. The first planar substrate of a semiconductor material, is located on a planar surface of a sub-mount and having a planar first edge, wherein said first substrate includes a plurality of lasers, each laser having an optical output at the first edge. The second planar substrate of a different second material, the second substrate being located on said planar surface of said sub-mount and having a planar second edge, wherein said second substrate includes a plurality of planar light guiding structures, each of said light-guiding structures having an end at the second edge, said second edge facing said first edge. The alignment assembly is located on said sub-mount, said alignment assembly including rigid standoff structures configured to fixedly vertically align said first and second edges above said sub-mount such that each optical output of one of said lasers is vertically aligned with the end of one of said light-guiding structures.

Another embodiment is a method of manufacturing an optical communication system. A vertical alignment assembly is formed on a planar surface of a sub-mount, said alignment assembly including rigid standoff structures on said surface. A first planar substrate is positioned over said planar surface of said sub-mount, the first substrate having a planar first edge, said first substrate includes a plurality of lasers each having an optical output the first edge. A second substrate is positioned over said planar surface of said sub-mount, said second substrate including a plurality of planar light guiding structures and a planar second edge facing the first edge, each of said light-guiding structures having an end at the second edge. The standoff structures are configured to support one of said first substrate and said second substrate such that said optical outputs each one of said lasers are rigidly vertically aligned with said ends of said light-guiding structures.

BRIEF DESCRIPTION OF THE DRAWINGS

The embodiments of the disclosure are best understood from the following detailed description, when read with the accompanying FIGUREs. Corresponding or like numbers or characters indicate corresponding or like structures. Various features may not be drawn to scale and may be arbitrarily increased or reduced in size for clarity of discussion. Various features in figures may be described as "vertical" or "lateral" for convenience in referring to those features. Such descriptions do not limit the orientation of such features with respect to the natural horizon or gravity. Reference is now made to the following descriptions taken in conjunction with the accompanying drawings, in which.

DETAILED DESCRIPTION

Various embodiments of the disclosure benefit from the recognition that an efficient light transmitter, such as used in optical communication systems, can be enhanced by constructing optical waveguide components and light-emitting components from two different substrates that are better adapted for these different respective functions. This hybrid integration, however, typically requires a precise alignment between the two substrate to ensure efficient light transmission between the components on either substrate. Various embodiments of the disclosure further benefit from the recognition that the efficient light transmission from a laser to an optical waveguide is increased by incorporating an alignment assembly into the system to facilitate the precise alignment of the laser's output with the input end of the waveguide.

Figure 1:
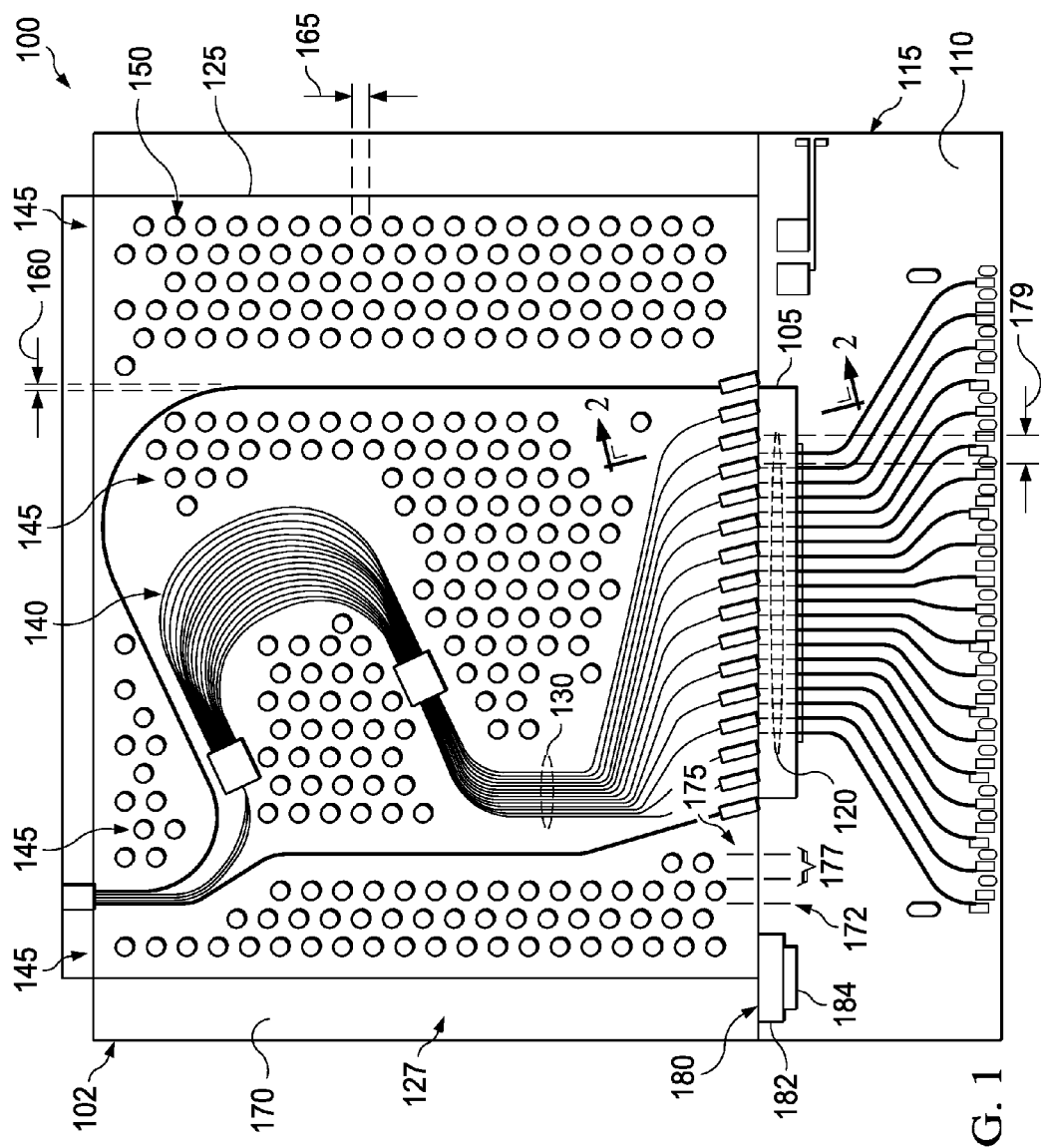
FIG. 1 shows a plan view of portion of an example optical communication system of the disclosure having an optical transmitter circuit package.

One embodiment of the present disclosure is an optical communication system. FIG. 1 shows a plan view of portion of an example optical communication system 100 of the disclosure having an optical transmitter circuit package 102, and FIG. 2, shows a cross-sectional view of a portion of the example optical transmitter circuit package 102 depicted in along view lines 2-2 in FIG. 1.

Figure 2:
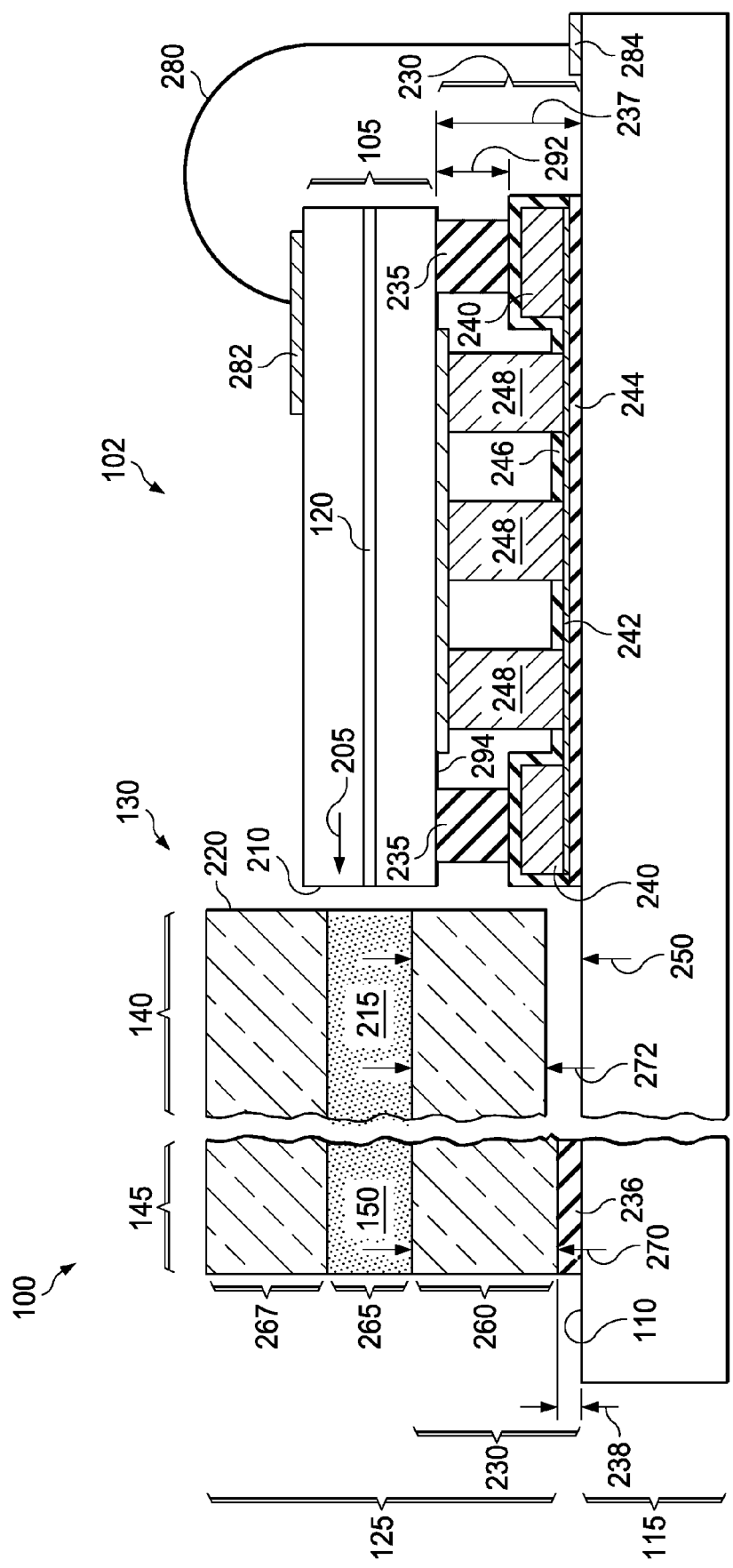
FIG. 2 shows a cross-sectional view of a portion of the example optical transmitter circuit package depicted in view lines 2-2 of FIG. 1.

With continuing reference to FIGS. 1 and 2, the optical transmitter circuit package 102 includes a first substrate 105, located on a planar surface 110 of a sub-mount 115. Some preferred embodiments of the sub-mount 115 include a rigid material such as silicon. The first substrate 105 includes a plurality of lasers 120 having an optical output 205 that terminates at an edge 210 of the first substrate 105. The package 102 also includes a second substrate 125 located on the planar surface 110 of the sub-mount 115. The second substrate 125 includes a plurality of planar light guiding structures 130. Each of said light-guiding structures 130 have a core 215 that terminates at an edge 220 of the second substrate 125. The edge 220 of the second substrate 125 opposes the edge 210 of the first substrate 105.

The package 102 also includes an alignment assembly 230 located on the sub-mount 115 (e.g., the planar surface 110). The alignment assembly 230 including standoff structures 235. The standoff structures 235, 236 are configured to hold one or both of the first substrate 105 (e.g., structure 235) and the second substrate 125 (e.g., structure 236) a vertical distance 237, 238 above the sub-mount 115 (e.g., the planar surface 110) such that the optical output 205 from each one of the lasers 120 is vertically aligned with one of the light-guiding structures 130 (e.g., the core 215 of a particular light-guiding structure 130).

In some preferred embodiments, there is only a first standoff structure 235 that holds the first substrate 105 the vertical distance 237 above the sub-mount 115. In such cases, the second standoff structure 236 is not present and at least a portion of the second substrate 125 rests directly on the planar surface 110 of the sub-mount 115. In other embodiments, however, the second standoff structure 236 holds the second substrate 125 the vertical distance 238 above the sub-mount 115 and the first standoff structure 235 is not present.

In some embodiments, such illustrated in FIG. 2, the alignment assembly 230 can further include electrical circuit components 240, 242, 244, 246 coupled to the lasers 120 (e.g., via solder bumps 248). The electrical circuit components can include conductive lines 240, 242 (e.g., gold lines 240, or TiPt lines 242 that help adhere the gold lines 240 to the sub-mount 115), and insulating layers 244, 246 (silicon oxide layers 244 or silicon nitride layers 246) that electrically isolate and physically protect the conductive lines 240, 242. One skilled in the art would understand how the conductive lines 240, 242 can serve to bring power to the lasers 130 and monitor the lasers 130.

As further illustrated, in such embodiments, the standoff structures 235 can be located on one or more of the electrical circuit components 240, 242, 244, 246. That is, the electrical circuit components 240, 242, 244, 246 can also serve as part of the vertical distance 237 to vertically align the laser 130 and the light-guiding structures 130. This can be advantageous because the electrical circuit components 240, 242, 244, 246, with standard deposition and patterning techniques used in the semiconductor processing, can be made to very precise dimensions. This, in turn, allows a shorter standoff 235 to be constructed, which in some cases, facilitates the vertical distance 237 being more precisely defined. For instance, in some embodiments, the vertical distance 237 in a range of about 5 to 10 microns and the precision of the distance 235 is ±10 percent. In other cases, however, the standoff 235 can be formed directly on the sub-mount 115, and, in such cases, the electrical circuit components 240, 242, 244, 246 are not part of the alignment assembly 230. Some embodiments of the standoff structures 235 can be electrically isolated and are not part of the electrical components that serve to power or control the lasers 120.

To facilitate better or optimal vertical alignment between the laser's optical output 205 and the core 215, it is also desirable for the core 215 to be located a precise vertical distance 250 (e.g., 5 to 10 microns±10 percent, for some embodiments) above sub-mount 115 (e.g., the planar surface 110). To facilitate providing a precise vertical distance 250, some embodiments the second substrate 125 includes an upper cladding layer 260 that has a first region 140 located above the light-guiding cores 215 of a core layer 265 of the light-guiding structures 130, and, a second region 145 located above support posts 150 of the core layer 265. That is, the support posts 150 are composed, e.g., of a same material as the light-guiding cores 215.

As illustrated in FIG. 2, because the second substrate 125 can be flip-chip bonded to the sub-mount 115, the upper cladding layer 260 can rest on the planar surface 110 and thereby can define the vertical distance 250. The light-guiding structures 130 also includes a lower cladding layer 267, which e.g., when the second substrate 125 is situated on the sub-mount 115, can be the upper-most portion of the light-guiding structures 130.

As further illustrated for the example embodiment shown in FIG. 2, a thickness 270 of the cladding layer 260 in the second cladding region 145 is greater than a thickness 272 of the cladding layer 260 in the first region 140, and, the second substrate 125 contacts the sub-mount 115 only through the second region 145. Moreover in some embodiments, an average thickness 270 in the second cladding region 145 is more uniform (e.g., ±1 micron or less in some cases) than an average thickness 272 of the first cladding 140 region (e.g., greater than ±1 micron in some cases). Having the second region's cladding layer have a greater and more uniform thickness 270 than in the first region, is facilitated by the presence of the support posts 150.

After being deposited over the patterned core layer 265, the upper cladding layer 260 can reflowed (e.g., re-melted) using procedures familiar to those skilled in the art. However, after reflowing, portions of the upper cladding layer 260 located directly adjacent (e.g., direct below as depicted in FIG. 2, or directly above prior to flip-chip bonding) the cores 215 of the light-guiding structures 130 can sag as the cladding layer 260 reflows into spaces in-between the narrow cores 215 (e.g., cores 215 having a lateral width 160 in a range from of about 3 to 5 microns). Consequently, the thickness 272 in this region 140 of the cladding layer 260 can be reduced and thereby become more non-uniform.

In contrast, providing plurality of the support posts 150 helps to prevent the upper cladding layer 260 adjacent to the posts 150 from sagging in the second region 145 during the reflow. In some preferred embodiments, e.g., a lateral width 165 of the support posts 150 is about 10 times greater than the lateral width 160 of the light-guiding cores 215. Consequently, the overall thickness 270 of the cladding layer 260 in this region 145 is substantially not reduced and the non-uniformity of the thickness 270 is not increased due to the reflow procedure.

In addition to help situate the light guiding structures' cores 215 a precise vertical distance 250 above the sub-mount 115, a larger thickness 270 cladding 260 in the second region 145 also helps to protect the cores 215 below the first cladding region 140. For instance, when the second substrate 125 is flip-chip bonded to the sub-mount 115, the larger thickness 270 cladding 260 in the second region 145 also prevents the first region 140 from contacting the sub-mount 115 and thereby potentially damaging the cores 215.

In other embodiments, however, such as when a more relaxed vertical alignment tolerance between the core 215 and laser's optical output 205 is acceptable or otherwise achievable, the second substrate 125 may not have support posts, and the region 140 of cladding 260 adjacent to the cores 215 may directly contact the sub-mount 115.

In some embodiments, such as illustrated in FIG. 1, the plurality of light-guiding structures 130 is greater in number than the plurality of lasers 120. For instance, in some embodiments there can be ten lasers 120 with optical output 205 at the first substrate's edge 210 and fourteen light-guiding structures 130 at the input edge 220 of the second substrate 125. Having a greater number of light-guiding structures 130 can be advantageous in cases where it may be difficult to match the filtering frequencies of the light-guiding structures 130, e.g., configured as an array wave guide (AWG), with the optical output frequencies of the lasers 120.

For instance, in some embodiments, the output frequencies of the lasers 120 are adjusted so as to be fixed to particular values, e.g., to match particular frequencies, and frequency separations, set by a standards body, such as the International Telecommunication Union. In some instances, however, because of fabrication variations, it may be difficult to manufacture the light-guiding structures 130 such that their filtering frequencies match the fixed output frequencies of the laser 120. In such instances, it can be advantageous to manufacture additional the light-guiding structures 130 whose filtering frequencies could exceed the range of fixed output frequencies of the laser 120. E.g., in some cases, there may be fabricated one or two additional the light-guiding structures 130 having filtering frequencies that are lower than the range of laser output frequencies, and, one or two additional the light-guiding structures 130 having filtering frequencies that are greater than the range of laser output frequencies. Then, if fabrication variations should yield some light-guiding structures 130 that are not at the desired filtering frequencies, one or more of the additional light-guiding structures 130 can be laterally aligned with the lasers 120 to thereby provide a better match with the laser's output frequencies.

In some embodiments, to facilitate lateral alignment between the optical output 205 from each one of the lasers 120 and one of the light-guiding structures 130 the second substrate 125 and sub-mount 115 can include vernier lines. For instance, as illustrated in FIG. 1, an upper surface 170 of the second substrate 125 can further includes a first set of vernier lines 172 and the planar surface 110 of the sub-mount 115 can further includes a second set of vernier lines 175. The vernier lines 172, 175 can be configured such that, when the first set of vernier lines 172 are aligned with the second set of vernier lines 175, at least some of the cores 215 of the light-guiding structures are substantially laterally aligned with the optical output 205 from the lasers 120.

In some embodiments, to facilitate lateral alignment with particular ones of the lasers 120, the spacing 177 between adjacent vernier lines (e.g., adjacent lines 172 on the second substrate 125, or, adjacent lines 175 on the sub-mount 115) are made to substantially equal to the spacing 179 between adjacent lasers 120 (e.g., a spacing about 550 microns in some embodiments), or in some cases a fractional integer of the spacing 179 (e.g., the vernier spacing 177 is $\frac{1}{2}$, $\frac{1}{4}$, $\frac{1}{8}$, $\frac{1}{10}$, or $\frac{1}{20}$ of the laser spacing 179).

To facilitate the lateral optical alignment between the lasers 120 and at least some of the light-guiding structures 130, there can be a second alignment assembly 180 located on the planar surface 110 of the sub-mount 115. The second alignment assembly 180 can include a slider structure 182 configured to move the second substrate 125 such that at least some of the light-guiding structures 130 (e.g., the cores 215) are actively laterally aligned with the optical output 205 from each of the lasers 120. The second alignment assembly 180 may further include clips 184 that are configured to fix the second substrate's location in place once the active alignment has optimized the optical output 205 passed to the light-guiding structures 130.

The term, active lateral alignment, as used herein refers to a process where the lasers 120 are coupled to the electrical components 240, 242, 244, 246 through which power is sent to the lasers 120 to generate the optical output 205. To maximize the throughput transferred from the lasers 120 to the light-guiding structures 130, power output from the light-guiding structures 130 is monitored while the second substrate 125 is laterally moved (e.g., actively aligned as assisted using the second alignment assembly 180) over the planar surface 110. In some cases the presence of the vernier lines 172, 175 can help guide the active alignment process.

In some embodiments such as shown in FIGS. 1 and 2, the first substrate 105 can provide a common platform (e.g., a planar platform) to precisely set the lasers 120 to a common height to be fixed in place (e.g., as part of making electrical connections to the laser 120). In such embodiments, the active lateral alignment is accomplished by moving the second substrate 125.

In other embodiments, such as when active alignment is not performed, the second substrate 125 could be fixed to the planar surface 110 and the first substrate 105 could be laterally aligned analogous to that described above, e.g., as aided with vernier lines on the first and second substrates 105, 125, or, as aided using a second alignment assembly configured to move the first substrate 105.

As noted above, efficient light transmission in the system 100 is enhanced by constructing the lasers 120 and light-guiding structures 130 on different substrates (e.g., the first and second substrates 105, 125, respectively) that are better adapted for these respective structures. In some embodiments, for instance, the first substrate 105, is composed of a first crystalline material and the second substrate 125 is composed of a second crystalline material that is different from the first crystalline material. In some preferred embodiments, the first crystalline material can be composed of a III-V semiconductor crystal that facilitates the construction of a semiconductor laser therefrom. Non-limiting examples include InP GaAs, or GaN. In some embodiments, the second crystalline material is composed of silicon, glass, or multilayered combinations thereof. For instance, the cladding layers 260, 267 can be composed of borophosphosilicate glass (BPSG) or phosphorus doped silica glass (PSG) and the core layer 265 can be composed of silicon.

In some embodiments, the lasers 120 are directly modulated lasers (DML). Non-limiting examples of the DML lasers 120 include Distributed Feedback lasers, Distributed Bragg Reflection lasers or Fabry-Perot lasers. In other embodiments, however, the lasers 120 are externally modulated lasers.

Figure 3:
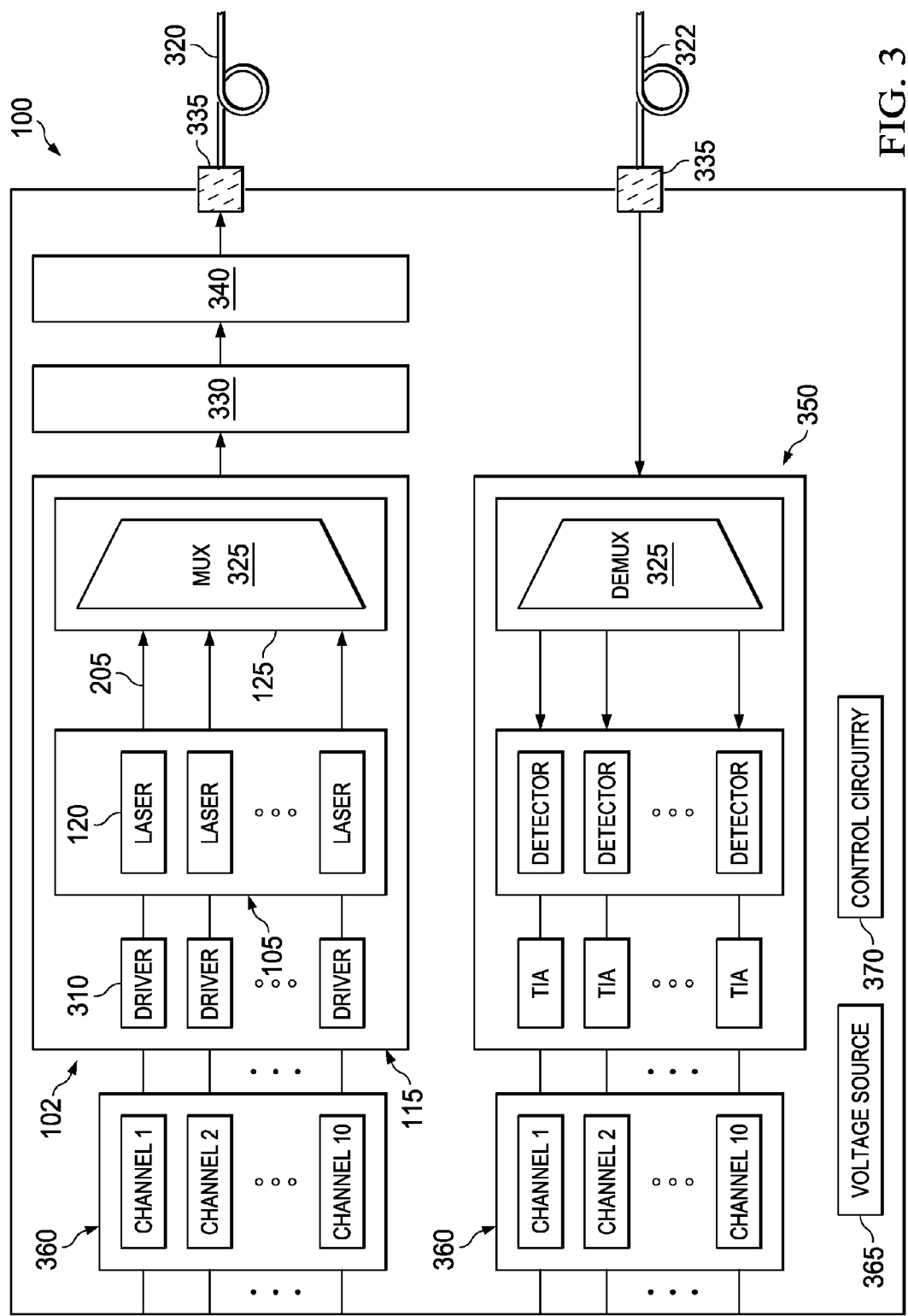
FIG. 3 shows a block diagram of an example an optical transmitter circuit package of the disclosure, such as the example packages discussed in the context of FIGS. 1 and 2.

Additional aspects of certain embodiments of the system 100 are presented in FIG. 3. FIG. 3 shows a block diagram of an example an optical transmitter circuit package 102 of the disclosure, such as the example packages discussed in the context of FIGS. 1 and 2. In some embodiments, the optical transmitter circuit package 102 is configured as a transmitter optical subassembly of the system 100, which in turn, is configured as an optical transceiver system.

As illustrated in FIG. 3, the transmitter optical subassembly 102 can further include one or more laser driver circuits 310 (e.g., coupled to the lasers 120 via the electrical components 240, 242, 244, 246; FIG. 2) configured to drive each of the lasers 120 so as to encode an electrical data signal into an optical data signal transmitted through the optical output 205. As also illustrated, the optical transceiver system 100 can be configured for 2-way optical communication e.g., via transmission optical fibers 320, 322.

In some embodiments of the optical transmitter circuit package 102 the light-guiding structures 130 (FIG. 1) are part of an AWG 325 configured to multiplex (MUX) an optical data signal carried in the optical output of the laser 120 and transferred to the light guiding structures 130 (e.g., wavelength division multiplexing, such as dense wavelength division multiplexing).

In some embodiments, the transmitter optical subassembly 102 further includes an optical assembly 330 configured to direct the optical output 205 from the AWG 325 to an optical fiber coupler 335 of the optical transceiver system 100. In certain embodiments, such as where the second substrate 125 is laterally adjusted such as described above to align the light-guiding structures 130 with the lasers 120, the optical assembly 330 can be configured to optimize the transfer of optical output from the AWG 325 to the optical fiber 320 that is coupled to the subassembly 102. For instance, embodiments of the optical assembly 330 can include mirrors, lenses and adjustable stages to facilitate the efficient transfer the optical output from the AWG 325 to the fiber 320.

Some embodiments of the transmitter optical subassembly 102 can further include a passive optical filter 340 configured to receive the optical output from the AWG 325. Examples of such filters 340 are described in the above-incorporated "Appl-1" patent application.

Some embodiments of the optical transceiver system 100 further include a receiver optical subassembly 350. Embodiments of the subassembly 350 can include an AWG 325 to de-multiplex (DEMUX) an optical data signal carried e.g., via a optical fiber 322 from another transceiver 100, as well as detectors and transimpedance amplifiers (TIA). Examples of the receiver optical subassembly 350 are described in the above-incorporated "Appl-2" and "Appl-3" patent applications.

One skilled in the art would be familiar with other components to facilitate the operation of the transceiver 100, such as a multichannel clock and data recovery circuits 360, voltage source 365 and control circuitry 370 (e.g., voltage and current control circuitry, or alarm and performance monitoring circuitry).

Figure 4:
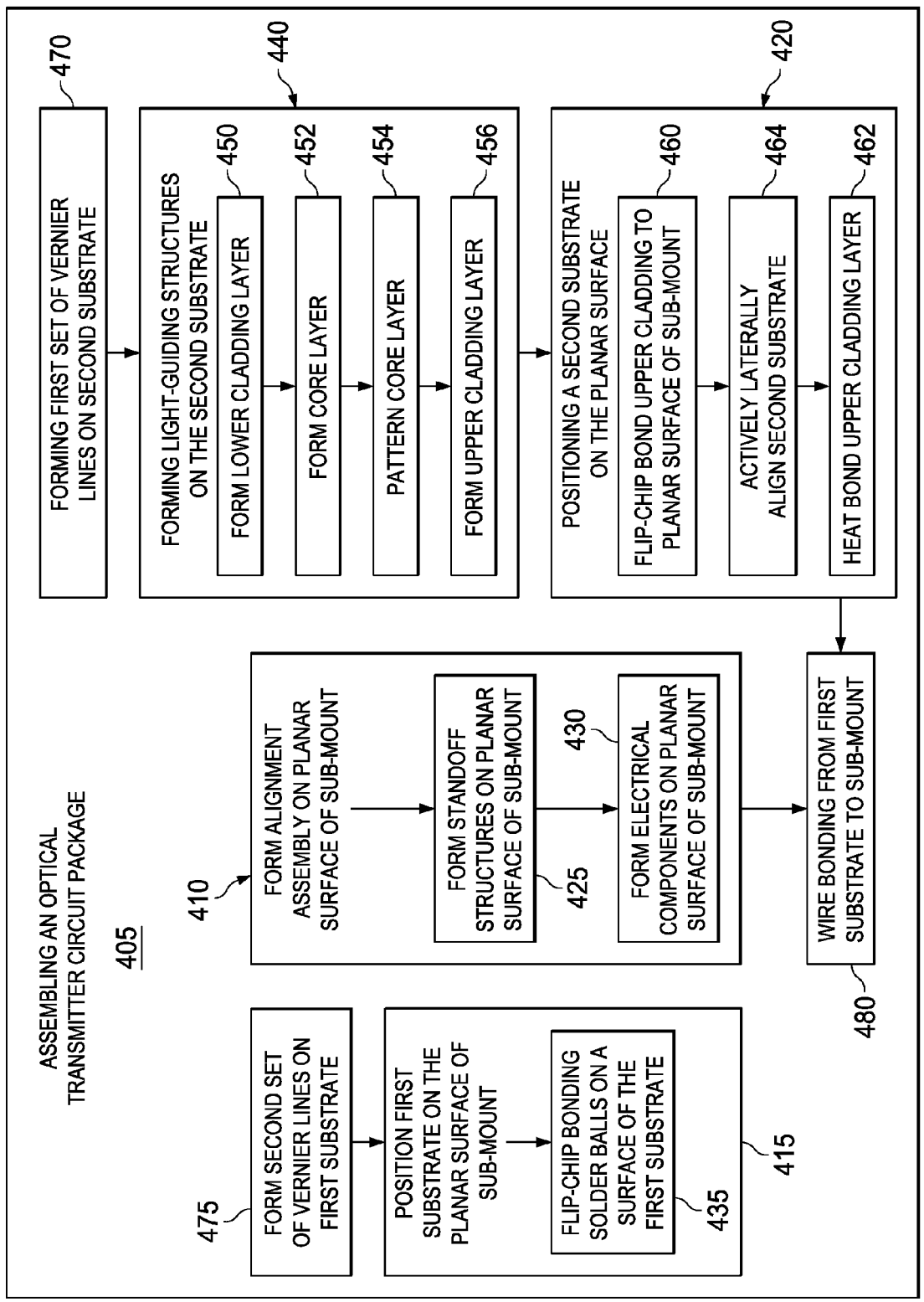
FIG. 4 presents a flow diagram of example methods of manufacturing an optical communication system in accordance with the disclosure, such as any of the example systems discussed in the context of FIGS. 1-3.

Another embodiment of the disclosure is a method of manufacturing an optical communication system. FIG. 4 presents a flow diagram of an example method of manufacturing an optical communication system in accordance with the disclosure, such as any of the systems 100 discussed in the context of FIGS. 1-3.

With continuing reference to FIGS. 1-3 throughout, the method embodiment depicted in FIG. 4 comprises a step 405 of assembling an optical transmitter circuit package 102. Assembling the package 102 (step 405) includes a step 410 of forming an alignment assembly 230 on a planar surface 110 of a sub-mount 115, the alignment assembly 230 including standoff structures 235, 236. Assembling the package 102 (step 405) also includes a step 415 of positioning a first substrate 105 on the planar surface 110 of the sub-mount 115. The first substrate 105 includes a plurality of lasers 120 each having an optical output that terminates at an edge 210 of the first substrate 105, and, the first substrate 105 lays on the standoff structures 235.

Assembling the package 102 (step 405) also includes a step 420 of positioning a second substrate 125 on the planar surface 110 of the sub-mount 115. The second substrate 125 includes a plurality of planar light guiding structures 130, each of the light-guiding structures having a core 215 that terminates at an edge 220 of the second substrate 125. The edge 220 of the second substrate 125 opposes the edge 210 of the first substrate 105. The standoff structures 235, 236 are configured to hold one or both of the first substrate 105 (e.g., structure 235) or the second substrate a vertical distance 237, 238 above the sub-mount 115 such that the optical output 205 from each one of the lasers 120 is vertically aligned with one of the light-guiding structures 130.

In some embodiments, forming the alignment assembly 230 (step 410) can further include a step 425 of forming the standoff structures 235 on the planar surface 110 of the sub-mount 115. In some preferred embodiments, to provide structural support to the substrate 105, a plurality the standoff structures 235 are formed on the planar surface 110, such that, e.g., there are standoff structures 235 below the spaces 179 between each of the laser 120. Such a configuration of support structures 235 can beneficially provide structural support to the first substrate 105, e.g., when a wire bond 280 is formed between the layer 282 on the substrate 105 and ground layer 284 on the sub-mount 115.

A variety of standard micro-fabrication techniques used in semi-conducting industry can be used to form standoff structures 235, 236 in accordance with step 425 so as to have a precise vertical dimension (e.g., ±10 percent or less). For instance, in some cases, the standoff structures 235, 236 can be made from a photo-resist material (e.g., bisbenzocyclobutene) that is spin-coated on to the planar surface 110 and then patterned to form the standoff structures 235. In some embodiments, the standoff structures 235 have lateral dimension of about 30 microns×30 microns and a height 290 of about 5 microns. In other cases, a photo-resist layer on the surface can be patterned to form openings which are then filled with a metal, or other material such as silicon oxide, followed by lifting off the remaining photo-resist the standoff structures 235, 236 composed of the metal or other material. In still other cases, the sub-mount 115 surface 110 can be patterned and etched to form standoff structures 235, 236 that are composed of the sub-mount 110 itself. Based on the present disclosure of skilled in the art would appreciate the variety of other methods that could be used to form the standoff structures 235, 236 in accordance with step 425.

In some embodiments, forming the alignment assembly 230 (step 410) can further include a step 430 of forming electrical components 240, 242, 244, 246 on the planar surface 110 of the sub-mount 115. Standard micro-fabrication techniques, similar to that used to form the standoff structures 235 in step 425, can be used to form the electrical components 240, 242, 244, 246. In some embodiments, the total height 292 of the electrical components 240, 242, 244, that the standoff structures 235 are formed on in step 430, equal about 3.3 microns. In some embodiments, the height 290 of the standoff structure 235 plus the total height 292 of the electrical components 240, 242, 244 equals the vertical distance 237 of the first substrate 105 above the sub-mount 115.

In some embodiments, positioning the first substrate 105 on the planar surface 110 in step 415 includes a step 435 of flip-chip bonding solder bumps 248 on a surface 294 of the first substrate 105 to the one of more of the electrical components 242. Prior to the flip-chip bonding step 435 the solder bumps 248 on the first substrate's surface 294 are much taller than the standoff structure 235 or the target vertical distance 237. However, when the first substrate is flipped onto the sub-mount 115 such the it contacts the electrical components 242, the temperature of the package 102 is raised above the melting point of the solder while putting pressure on the first substrate 102 and the sub-mount 115. Subsequently, the solder bumps 248 decreases until the first substrate 105 stops against the standoff structure 235. The temperature of the package 102 is then decreased such that the solder bumps 248 solidify and the first substrate 105 is held the desired vertical distance 237 above the sub-mount 115.

Some embodiments of the method further include a step 440 of forming the light-guiding structures 130 on the second substrate 125. Forming the light-guiding structures 130 (step 445) can include a step 450 of forming a lower cladding layer 267 on the second substrate 125, a step 452 of forming a core layer 265 on the lower cladding layer 267, a step 454 of patterning the core layer 265 to form the cores 215 of the light-guiding structures 130, and a step 456 of forming an upper cladding layer 260 on the patterned core 215. One skilled in the art would be familiar with techniques such as chemical vapor depositing or flame hydrolysis, or re-melting procedures, to form the cladding layers 260, 267 (e.g., composed of silicon oxides) or the core layer 265 (e.g., composed of silicon).

In some cases, the step 445 of forming the light-guiding structures 130 is performed in a first region 140 of the core layer 265, e.g., that corresponds to an AWG. In some cases, the patterning step 454 further includes patterning a region (e.g., a second region 145) of the core layer 265, separated from the light-guiding structures 130 in the first region 140, to form support posts 150.

In some embodiments, positioning the second substrate 125 on the planar surface 110 in step 420 includes a step 460 of flip-chip bonding an upper cladding layer 260 of the second substrate 125 to the planar surface 110 of the sub-mount 115. In some embodiments, for instance, the upper cladding layer 260 is made of a low melting-point cladding material, such as borophosphosilicate glass, so this layer 260 can be partially melted, in a heat bonding step 462, so as to bond the layer 260 to the planar surface 110 without effecting the other layers 265, 267 of the second substrate 125, or, the first substrate 105. In some cases the flip-chip bonding step 460 includes holding the upper cladding layer 260 on second standoff structures 236.

In some embodiments, positioning the second substrate 125 on the planar surface 110 in step 420 includes a step 464 of laterally actively aligning the second substrate 125 using a second alignment assembly 180. For instance, as part of step 464, prior to the heating step 262, the second substrate 125 can be moved along the slider structures 182 until the optical output 205 transferred from the laser 120 through the light-guiding structures 130 is maximized and then fixed in place via the clips 184.

In some embodiments, the method further includes a step 470 of forming a first set of vernier lines 172 on the second substrate 125. In some embodiments, the method further includes a step 475 of forming a second set of vernier lines 175 on the planar surface 110 of the sub-mount 115. As non-limiting examples, the vernier lines 172, 175, formed in either step 470 or step 475, can be trenches formed in portions of the sub-mount 115 or second substrate 125 using conventional photolithographic patterning and etching procedures. Or, a material layer (e.g., a metal, or photo-resist layer) formed on the sub-mount 115 or second substrate 125 can be patterned to form raised vernier lines 172, 175 in steps 470 or 475. Based on the present disclosure, one skilled in the art would appreciate that other processes could be performed to form the vernier lines 172, 175 in accordance with steps 470 or 475.

In some embodiments, the method further includes a step 480 of bonding a wire 280 between a metal layer 282 (e.g., a bond pad) located on the first substrate 105 and an electrical ground layer 284 on the planar surface 110 of the sub-mount 115. The standoff structures 235 can help provide structural integrity to the lasers 120 to avoid damage when the wire bonding is done in accordance with step 480. However, in other embodiment, one or more solder bumps 248 can be used to form a ground connection to the first substrate 105.

With continuing reference to FIGS. 1-4, another embodiment is an optical communication system 100. The system 100 comprises a first planar substrate 105 of a semiconductor material, located on a planar surface 110 of a sub-mount 115 and having a planar first edge 210, wherein said first substrate 105 includes a plurality of lasers 120, each laser 120 having an optical output at the first edge 210. The system comprises a second planar substrate 125 of a different second material, the second substrate being located on said planar surface 110 of said sub-mount 115 and having a planar second edge 220, wherein said second substrate 125 includes a plurality of planar light guiding structures 130, each of said light-guiding structures 130 having an end at the second edge 220, said second edge 220 facing said first edge 210. The system comprises an alignment assembly 230 located on said sub-mount 115, said alignment assembly 230 including rigid standoff structures 235, 236 configured to fixedly vertically align said first and second edges 210, 220 above said sub-mount 115 such that each optical output of one of said lasers 120 is vertically aligned with the end of one of said light-guiding structures 130.

In some cases the system 100 can comprise any one or more of the following features. Further comprise a plurality of metal structures 248 located between the first substrate 105 and the sub-mount 115 and forming electrical connections there between. The metal structures 248 are softer than the standoff structures 235. The second planar substrate 125 is a dielectric substrate. The second substrate 125 includes a cladding layer 140 that has a first region 140 located above light-guiding cores 215 of a core layer 265 of said light-guiding structures 130, and a second region 145 located above support posts 150 of said core layer 265. A thickness 270 of said cladding layer 260 in said second region 145 is greater than a thickness 272 of said cladding layer 260 in said first region 140, and, said second substrate 125 contacts said sub-mount 115 only through said second region 145. A lateral width 165 of said support posts 150 is about 10 times greater than a lateral width 160 of said light-guiding cores 215. The plurality of light-guiding structures 130 is greater in number than said plurality of lasers 120. An upper surface 170 of said second substrate 125 further includes a first set of vernier lines 172 and said planar surface 110 of said sub-mount 115 further includes a second set of vernier lines 175 such that when said first set of vernier lines 173 are aligned with said second set of vernier lines 175, at least some of said cores 215 of said light-guiding structures 130 are substantially laterally aligned with said optical output from said lasers 120. The system 100 further includes a lateral second alignment assembly 180 capable of laterally moving one of the first edge 210 and the second edge 220 parallel to the surface 110 of the sub-mount 115 with respect to the other of the first edge 210 and the second edge 220. The first substrate 105 is composed of a first crystalline material and said second substrate 125 is composed of a second non-crystalline material. The lasers 120 are directly modulated lasers. The system 100 includes an optical transmitter circuit package 102 which is configured as a transmitter optical subassembly of said system, which is configured as an optical transceiver system. The light-guiding structures 130 are part of an arrayed waveguide configured to multiplex an optical data signal carried in said optical output of said laser 120 and transferred to said light guiding structures 130.

With continuing reference to FIGS. 1-4, another embodiment is method of manufacturing an optical communication system. The method comprises the following features. Forming a vertical alignment assembly 230 on a planar surface 110 of a sub-mount 115, said alignment assembly 230 including rigid standoff structures 235,236 on said surface 110. Positioning a first planar substrate 105 over said planar surface 110 of said sub-mount 115, the first substrate 105 having a planar first edge 210, said first substrate includes a plurality of lasers 120 each having an optical output the first edge 210. Positioning a second substrate 125 over said planar surface 110 of said sub-mount 115, said second substrate 125 including a plurality of planar light guiding structures 130 and a planar second edge 220 facing the first edge 210, each of said light-guiding structures 130 having an end at the second edge 220. The standoff structures 235, 236 are configured to support one of said first substrate 105 and said second substrate 125 such that said optical outputs each one of said lasers 120 are rigidly vertically aligned with said ends of said light-guiding structures 130.

In some cases, the method can comprise any one or more of the following features. Positioning said first substrate 105 over said planar surface 110 includes flip-chip bonding said first substrate 105 to solder bumps 248 located on said planar surface 110 of said sub-mount 115. Further comprises a providing plurality of metal structures 248 located between the first substrate 105 and the sub-mount 115 and forming electrical connections there between. The metal structures 248 are softer than the standoff structures 235, 236. The second planar substrate 125 is a dielectric substrate and the first substrate 105 is a semiconductor substrate. Further include laterally moving one of the first edge 210 and the second edge 220 parallel to the surface 110 of the sub-mount 115 with respect to the other of the first edge 210 and the second edge 220 such that the optical outputs are laterally aligned with the ends.

Although the embodiments have been described in detail, those of ordinary skill in the art should understand that they could make various changes, substitutions and alterations herein without departing from the scope of the disclosure.

The invention claimed is:

1. An optical communication system, comprising:
    a first planar substrate of a semiconductor material, located on a planar surface of a sub-mount and having a planar first edge, wherein said first substrate includes a plurality of lasers, each laser having an optical output at the first edge;
    a second planar substrate of a different second material, the second substrate being located on said planar surface of said sub-mount and having a planar second edge, wherein said second substrate includes a plurality of planar light guiding structures, each of said light-guiding structures having an end at the second edge, said second edge facing said first edge; and
    an alignment assembly located on said sub-mount, said alignment assembly including:
        rigid standoff structures to fixedly vertically align said first and second edges above said sub-mount, and
        one or more electrical circuit components, including at least one insulated electrical line insulated by a first insulating layer that is adjacent to one side of the one electrical line and by a second insulatin layer that is adjacent to an opposite side of the one electrical line, wherein the electrical line and the first and second insulating layers are located between said rigid standoff structures and said planar surface of said sub-mount, to fixedly vertically align said first edge above said sub-mount such that each optical output of one of said lasers is vertically aligned with the end of one of said light-guiding structures.

2. The system of claim 1, wherein said first and second insulating layers are a silicon oxide layer and a silicon nitride layer, respectively.

3. The system of claim 1, wherein the second planar substrate is a dielectric substrate.

4. An optical communication system, comprising:
    a first planar substrate of a semiconductor material, located on a planar surface of a sub-mount and having a planar first edge, wherein said first substrate includes a plurality of lasers, each laser having an optical output at the first edge;
    a second planar substrate of a different second material, the second substrate being located on said planar surface of said sub-mount and having a planar second edge, wherein said second substrate includes a plurality of planar light guiding structures, each of said light-guiding structures having an end at the second edge, said second edge facing said first edge; and
    an alignment assembly located on said sub-mount, said alignment assembly including rigid standoff structures configured to fixedly vertically align said first and second edges above said sub-mount such that each optical output of one of said lasers is vertically aligned with the end of one of said light-guiding structures wherein said second substrate includes a cladding layer that has a first region located above light-guiding cores of a core layer of said light-guiding structures, and a second region located above support posts of said core layer.

5. The system of claim 4, wherein a thickness of said cladding layer in said second region is greater than a thickness of said cladding layer in said first region, and, said second substrate contacts said sub-mount only through said second region.

6. The system of claim 4, wherein a lateral width of said support posts is about 10 times greater than a lateral width of said light-guiding cores.

7. The system of claim 4, wherein said plurality of light-guiding structures is greater in number than said plurality of lasers.

8. The system of claim 4, wherein an upper surface of said second substrate further includes a first set of vernier lines and said planar surface of said sub-mount further includes a second set of vernier lines such that when said first set of vernier lines are aligned with said second set of vernier lines, at least some of said cores of said light-guiding structures are substantially laterally aligned with said optical output from said lasers.

9. The system of claim 4, further including a lateral second alignment assembly capable of laterally moving one of the first edge and the second edge parallel to the surface of the sub-mount with respect to the other of the first edge and the second edge.

10. The system of claim 4, wherein said first substrate, is composed of a first crystalline material and said second substrate is composed of a second non-crystalline material.

11. The system of claim 4, wherein said lasers are directly modulated lasers.

12. The system of claim 4, wherein said system is configured as an optical transceiver system.

13. The system of claim 12, wherein said light-guiding structures are part of an arrayed waveguide configured to multiplex an optical data signal carried in said optical output of said laser and transferred to said light guiding structures.

14. A method of manufacturing an optical communication system, comprising:
forming a vertical alignment assembly on a planar surface of a sub-mount, said alignment assembly including: rigid standoff structures, and one or more electrical circuit component, located on said planar surface;
positioning a first planar substrate over said planar surface of said sub-mount, the first substrate having a planar first edge, said first substrate includes a plurality of lasers each having an optical output the first edge; and
positioning a second substrate over said planar surface of said sub-mount, said second substrate including a plurality of planar light guiding structures and a planar second edge facing the first edge, each of said light-guiding structures having an end at the second edge,
wherein said standoff structures are configured to support one of said first substrate and said second substrate such that said optical outputs each one of said lasers are rigidly vertically aligned with said ends of said light-guiding structures, and
one or more electrical circuit components, including at least one insulated electrical line insulated by a first insulating layer that is adjacent to one side of the one electrical line and by a second insulating layer that is adjacent to an opposite side of the one electrical line, wherein the electrical line and the first and second insulating layers are located between said rigid standoff structures and said planar surface of said sub-mount, to fixedly vertically align said first edge above said sub-mount, are part of said rigid vertical alignment assembly.

15. The method of claim 14, wherein positioning said first substrate over said planar surface includes flip-chip bonding said first substrate to solder bumps located on said planar surface of said sub-mount.

16. The method of claim 14, wherein said first and second insulating layers are a silicon oxide layer and a silicon nitride layer, respectively.

17. The method of claim 14, wherein the second planar substrate is a dielectric substrate and the first substrate is a semiconductor substrate.

18. The method of claim 14, further including laterally moving one of the first edge and the second edge parallel to the surface of the sub-mount with respect to the other of the first edge and the second edge such that the optical outputs are laterally aligned with the ends.

* * * * *